United States Patent
Tao et al.

(10) Patent No.: US 7,663,959 B2
(45) Date of Patent: Feb. 16, 2010

(54) POWER UP/DOWN SEQUENCE SCHEME FOR MEMORY DEVICES

(75) Inventors: Derek Tao, Fremont, CA (US); Chungjz Lu, Fongyuan (TW); Annie-Li-Keow Lum, San Jose, CA (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 103 days.

(21) Appl. No.: 12/119,092

(22) Filed: May 12, 2008

(65) Prior Publication Data

US 2009/0141579 A1    Jun. 4, 2009

Related U.S. Application Data

(60) Provisional application No. 60/991,076, filed on Nov. 29, 2007.

(51) Int. Cl.
*G11C 5/14* (2006.01)

(52) U.S. Cl. ........................... 365/226; 365/227

(58) Field of Classification Search ........... 365/226
See application file for complete search history.

(56) References Cited

U.S. PATENT DOCUMENTS

| | | | | |
|---|---|---|---|---|
| 5,659,517 A | * | 8/1997 | Arimoto et al. | 365/226 |
| 5,724,297 A | * | 3/1998 | Noda et al. | 365/226 |
| 5,726,946 A | * | 3/1998 | Yamagata et al. | 365/226 |
| 6,292,413 B1 | * | 9/2001 | Kato et al. | 365/200 |
| 6,384,674 B2 | * | 5/2002 | Tanizaki et al. | 327/544 |
| 6,744,298 B2 | * | 6/2004 | Yamauchi et al. | 327/333 |
| 7,145,383 B2 | * | 12/2006 | Mizuno et al. | 327/546 |

\* cited by examiner

*Primary Examiner*—Son L Mai
(74) *Attorney, Agent, or Firm*—K & L Gates LLP (57) ABSTRACT

A method for controlling a word line signal for a memory device during a power down process, comprising: pulling the word line signal down to a low logic state; disconnecting a current path from an external power supply to an internal power supply after the word line signal has been pulled down to the low logic state; and disconnecting a current path from an external ground voltage to an internal ground voltage after a current path from an external power supply to an internal power supply has been completely disconnected.

20 Claims, 7 Drawing Sheets

POWER UP/DOWN SEQUENCE SCHEME FOR MEMORY DEVICES

CROSS REFERENCE

The present application claims the benefit of U.S. Provisional Application Ser. 60/991,076, which was filed on Nov. 29, 2007.

BACKGROUND

The present invention relates generally to integrated circuit (IC) designs, and more particularly to a power up/down sequence scheme for memory devices.

Figure 1:
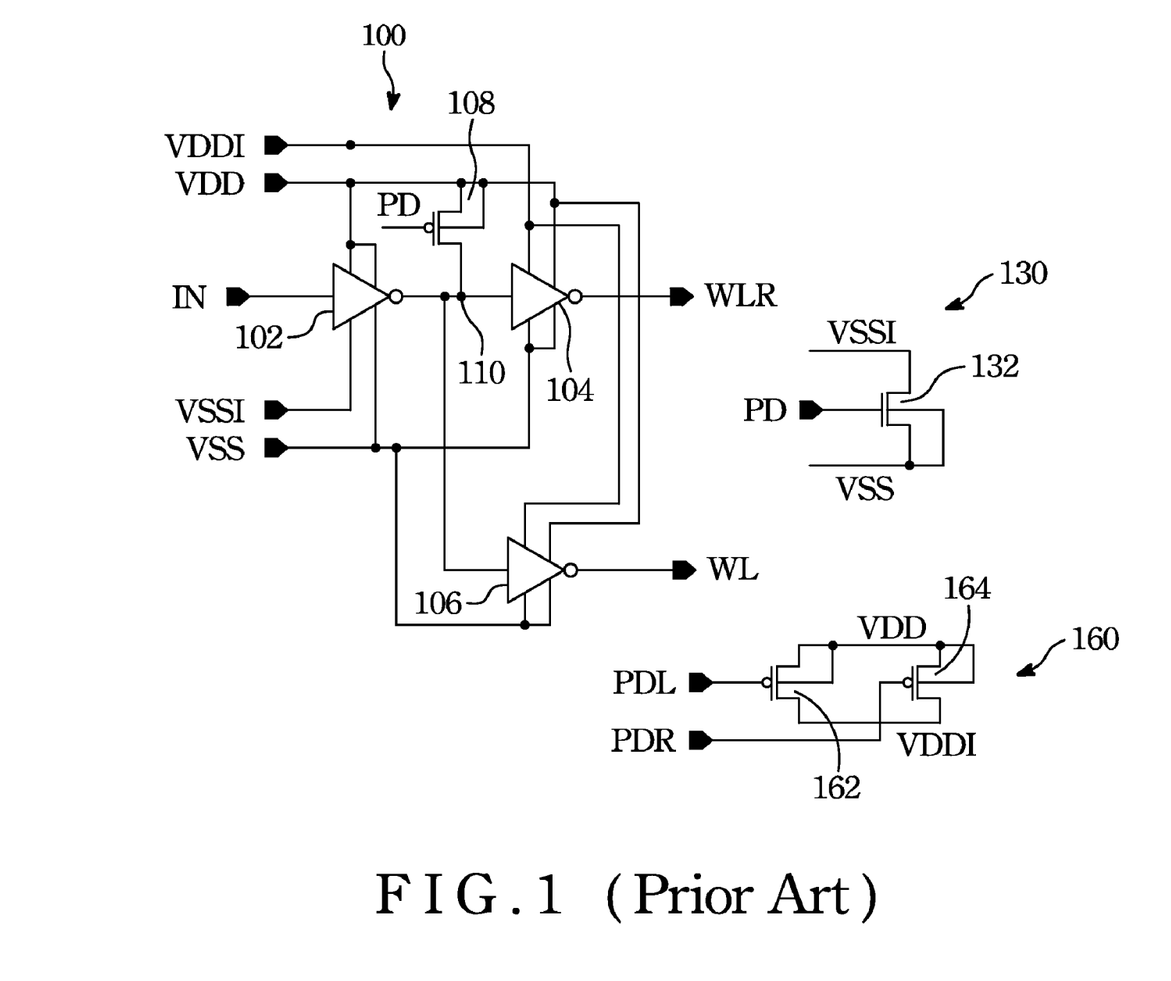
FIG. 1 illustrates various circuit modules supporting a conventional power down scheme for peripheral circuits of a memory device.

A memory device is usually implemented with a power down scheme that cuts off power supply to certain circuit modules when certain modes, such as the sleep mode or the standby mode, are activated in order to reduce the power consumption. A typical power down scheme utilizes an internal power control circuit, a power supply switch (VDD switch), and a ground voltage switch (VSS switch). FIG. 1 schematically illustrates the internal power control circuit 100, the VSS switch 130 and the VDD switch 160 that are needed for a typical power down scheme. The internal power control circuit 100 is comprised of an inverter 102 with its output terminal coupled to an input terminal of an inverter 104 and to an input terminal of an inverter 106. The inverter 102 is connected to an external power supply VDD, an external ground voltage VSS, and an internal ground voltage VSSI. The inverter 104 is connected to an external power supply VDD, an internal power supply VDDI, and the external ground voltage VSS. The inverter 106 is also connected to an external power supply VDD, an internal power supply VDDI, and the external ground voltage VSS. The output terminals of the inverters 104 and 106 are coupled to word lines WLR and WL, respectively. A PMOS transistor 108 is connected to the external power supply VDD at its source, and to a node 110, which is coupled to the output terminal of the inverter 102 and the input terminals of the inverters 104 and 106, at its drain. The gate of the PMOS transistor 108 is controlled by a power down signal (PD).

The VDD switch 160 is comprised of PMOS transistors 162 and 164 coupled between the external power supply VDD and the internal power supply VDDI. The gate of the PMOS transistor 162 is controlled by the first power supply switch control signal PDL, and the gate of the PMOS transistor 164 is controlled by the second power supply switch control signal PDR. The VSS switch 130 contains an NMOS transistor 132 coupled between the external ground voltage VSS and the internal ground voltage VSSI. The gate of the NMOS transistor 132 is controlled by the power down signal PD.

When a power down process is activated, the power down signal PD is pulled down to turn on the PMOS transistor 108 to pass the external power supply VDD to the input terminals of the inverters 104 and 106. As a result, the voltages on word lines WL and WLR are kept at a low level, and therefore maintain the data stored in a memory array (not shown in the figure) undisturbed by the power changes in peripheral circuits. The low power down signal PD turns off the NMOS transistor 132, and therefore isolating the external ground voltage VSS from the internal ground voltage VSSI. During the power down process, the first power supply switch control signal PDL and the second power supply switch control signal PDR are pulled to a high level to turn off the PMOS transistors 162 and 164, such that the external power supply VDD and the internal power supply VDDI are isolated from each other.

One drawback of the conventional power down scheme is the data glitch caused by the inappropriate timing of controlling the PMOS transistor 108, the VDD switch 160, and the VSS switch 130. During the power down process, the power down signal PD is pulled low, and the power supply switch control signals PDL and PDR are pulled high at the same time. The current path between the external power supply VDD and VDDI may be completely cut off before the PMOS transistor 108 is fully turn on. As a result, the VDDI line connected to the inverters 104 and 106 may be floating. This may cause the signals on the word lines WL and WLR to glitch, and therefore disturb the data stored in the memory array.

What is needed is power up/down scheme for peripheral circuits that does not disturb the data stored in memory arrays.

SUMMARY

The present invention is directed to a method for controlling a word line signal for a memory device during a power down process. In one embodiment of the present invention, the method includes pulling the word line signal down to a low logic state; disconnecting a current path from an external power supply to an internal power supply after the word line signal has been pulled down to the low logic state; and disconnecting a current path from an external ground voltage to an internal ground voltage after a current path from an external power supply to an internal power supply has been completely disconnected.

In another embodiment of the present invention, the method includes connecting a current path from an external ground voltage to an internal ground voltage; connecting a current path from an external power supply to an internal power supply after the current path from the external ground voltage to the internal ground voltage has been connected; and maintaining a word line at a normal operation mode after the current path from the external power supply to the internal power supply has been connected.

In yet another embodiment of the present invention, the method can be implemented in a memory device including: a power down control module for generating an initial pull up signal in response to a power down signal; a power down select module coupled to the power down control module for generating a pull up signal for enabling power control means to ensure a word line signal at a low logic state in response to the pull up signal; a first delay chain coupled to the power down control module and the power down select module, the first delay chain generating a first delayed signal in response to the initial pull up signal and sending the first delayed signal to the power down select module, which generates an internal power supply switch control signal in response to the first delayed signal, wherein a timing of the internal power supply switch control signal lags behind that of the pull up signal; a second delay chain coupled to the power down select module for generating a second delayed signal in response to an intermediate signal generated by the power down select module, the second delayed signal being fed back to the power down select module to generate an internal ground voltage switch control signal, wherein a timing of the internal ground voltage switch control signal lags behind that of the internal power supply switch control signal; and a decoder coupled to the power down select module for pulling the word line signal down to a low logic state in response to the pull up signal, disconnecting a current path from an external power supply to an internal power supply in response to the internal power supply switch control signal after the word line signal has been pulled down to the low logic state, and disconnecting a current path from an external ground voltage to the internal ground voltage in response to the internal ground voltage switch control signal after a current path from an external power supply to an internal power supply has been completely disconnected.

The construction and method of operation of the invention, however, together with additional objectives and advantages thereof will be best understood from the following description of specific embodiments when read in connection with the accompanying drawings.

DESCRIPTION

This invention is directed to a power up/down sequence scheme for memory devices. The following merely illustrates various embodiments of the present invention for purposes of explaining the principles thereof. It is understood that those skilled in the art will be able to devise various equivalents that, although not explicitly described herein, embody the principles of this invention.

Figure 2:
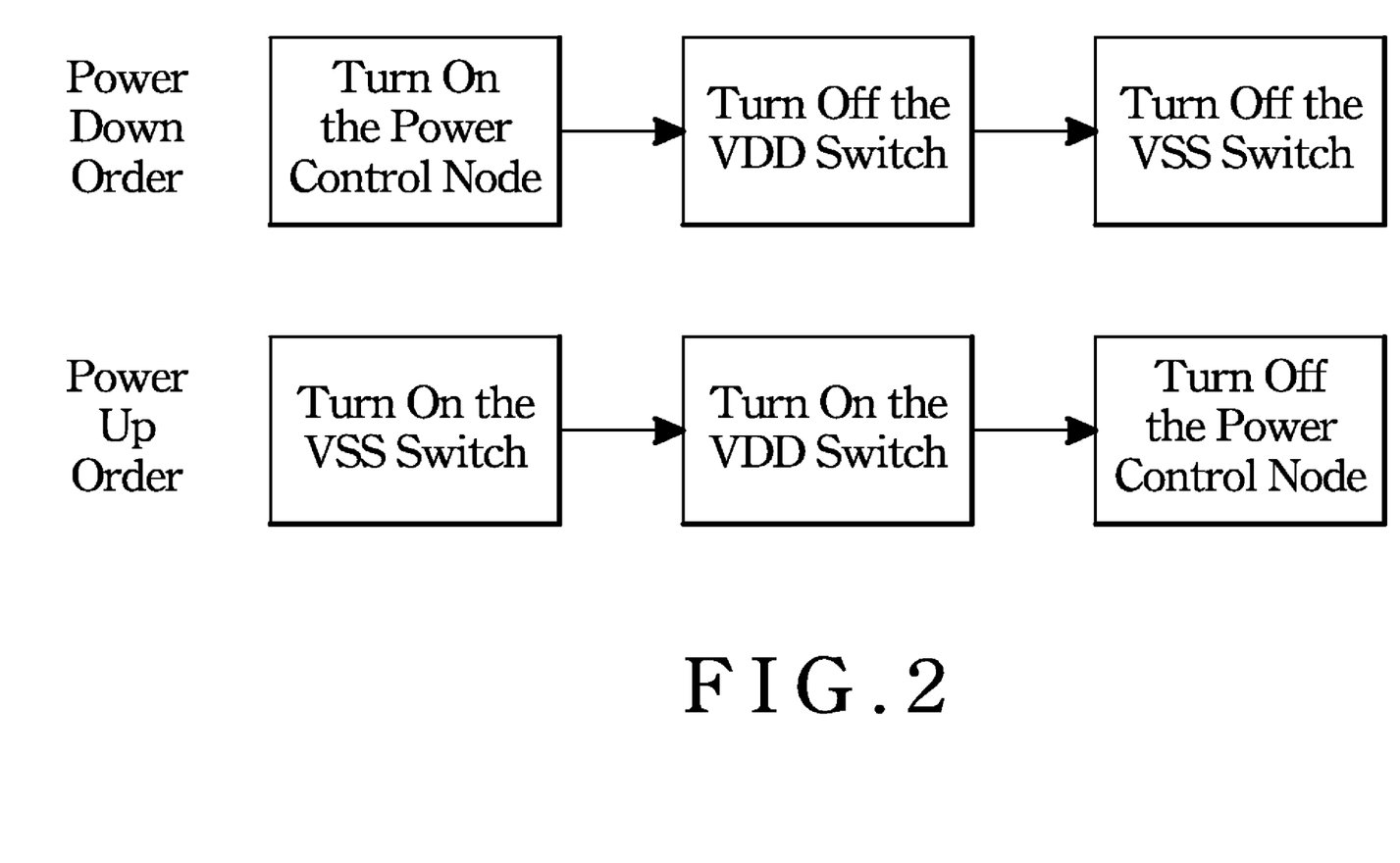
FIG. 2 illustrates a power up/down sequence scheme for peripheral circuits of a memory device in accordance with one embodiment of the present invention.

FIG. 2 illustrates a power up/down sequence scheme for peripheral circuits of a memory device in accordance with one embodiment of the present invention. In the proposed embodiment, the memory device, such as static random access memory (SRAM), dynamic random access memory (DRAM), flash memory, magnetoresistive random access memory (MRAM) and phase change memory includes a VDD switch, a VSS switch, and an internal power control circuit. The VDD switch turns on and off the current path between the external power supply VDD and the internal power supply VDDI. The VSS switch turns on and off the current path between the external ground voltage VSS and the internal ground voltage VSSI. The internal power control circuit controls the voltage at a pull up/down node in the memory device in order to control the voltage on the word lines. The proposed memory device includes a circuit design controlling the operation sequence of the VDD switch, the VSS switch, and the internal power control circuit, such that they do not operate at the same time.

Referring simultaneously to FIGS. 1 and 2, when the power down process is activated, the PMOS transistor 108 of the internal power control circuit 100 is turned on first to provide the node 110 with a voltage at VDD. As a result, the inverters 104 and 106 output signals are kept at low states on the word lines WLR and WL, respectively. After the PMOS transistor 108 is fully turned on, the VDD switch 160 is turned off to cut off the current path between the external power supply VDD and the internal power supply VDDI. Then, the VSS switch 130 is turned off to cut off the current path between the external ground voltage VSS and the internal ground voltage VSSI.

When the PMOS transistor 108 is fully turned on, the PMOS transistors (not shown in the figure) in the inverters 104 and 106 are kept at the off state as they output low signals on the word lines WLR and WL. Although the subsequently turned off VDD switch 160 would cause the internal power supply line VDDI floating, it does not affect the signals on the word line WLR and WL because the PMOS transistors coupled to the internal power supply line VDDI in the inverters 104 and 106 are turned off. Thus, the data integrity of the memory device can be maintained during the power down process.

During the power up process, the VSS switch 160 is turned on to conduct a current path between the external ground voltage VSS and the internal ground voltage VSSI. Subsequently, the VDD switch 130 is turned on to conduct a current path between the external power supply VDD and the internal power supply VDDI. Thereafter, the PMOS transistor 108 is turned off, so that the word lines WLR and WL can be accessed through the inverters 102, 104 and 106 for normal operation.

Figure 3:
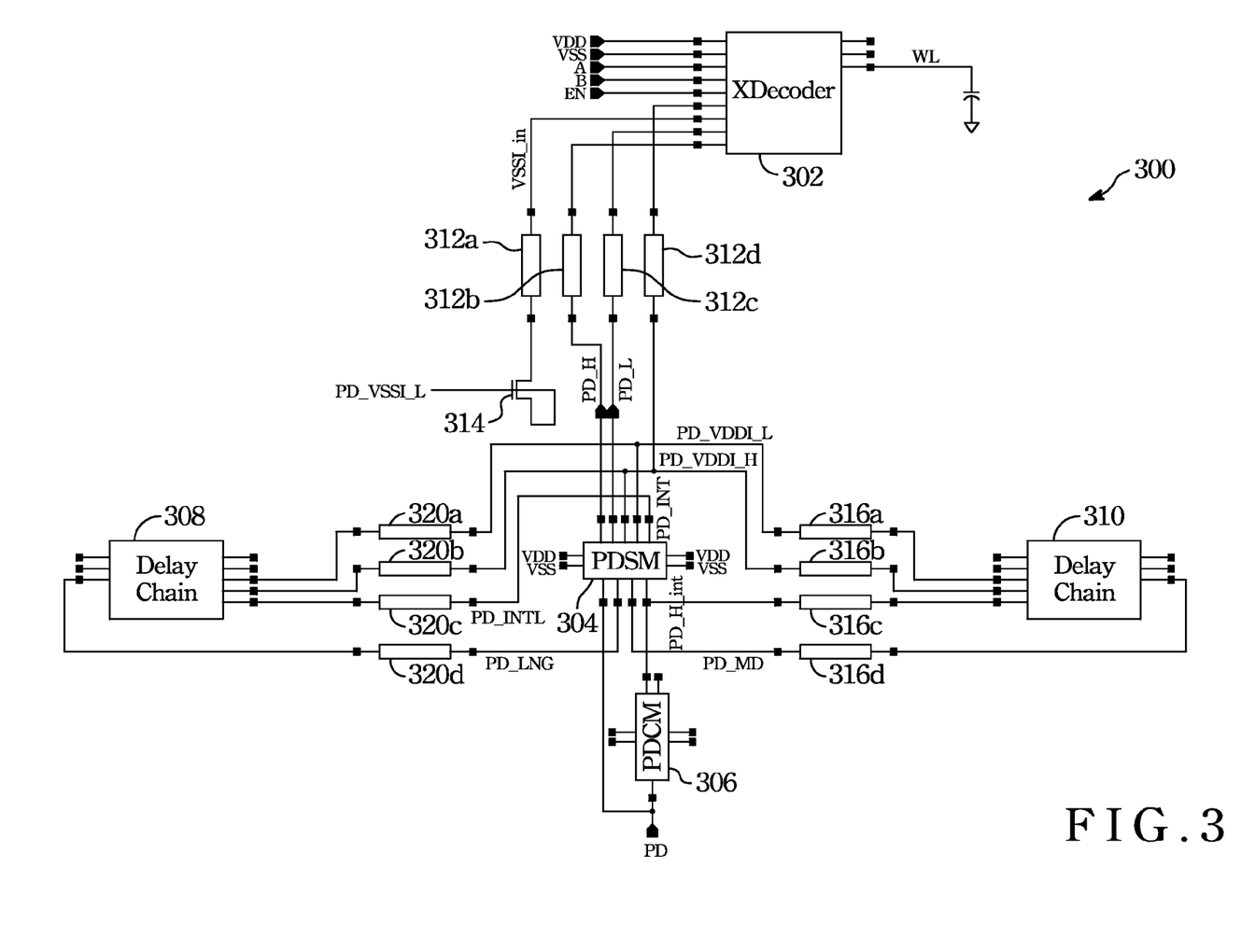
FIG. 3 schematically illustrates a memory device implemented with a proposed power up/down scheme in accordance with one embodiment of the present invention.

FIG. 3 schematically illustrates a layout of a memory device 300 implemented with the proposed power up/down scheme in accordance with one embodiment of the present invention. The memory device 300 is comprised of an x_decoder 302, power down select module 304, power down control module 306, and delay chains 308 and 310. The x_decoder 302 has input terminals coupled to the external power supply VDD, the external ground voltage VSS, decoder input signals A and B, an enable signal EN, and various input signals received from the power down select module 304. The x_decoder 302 has output terminals coupled to a word line WL, which is further connected to memory cell arrays (not shown in this figure). The x_decoder 302 is coupled to the power down select module 304 through loads 312b and 312c, and to the delay chains 308 and 310 through loads 312d, 316b, and 320b. The x_decoder 302 is also coupled to an NMOS transistor 314, which is controlled by an internal ground voltage switch control signal PD_VSSI_L.

The power down select module 304 is connected to the external power supply VDD and the external ground voltage VSS. The power down select module 304 is coupled to the delay chain 308 through loads 320a, 320b, 320c, and 320d, and to the delay chain 310 through loads 316a, 316b, 316c, and 316d. The power down select module 304 is also coupled to the power down control module 306 and a power down signal PD.

The circuits implementing the proposed power down sequence scheme are placed in the x_decoder 302, the power down select module 304, the power down control module 306, and the delay chains 308 and 310. The schematics and operations of the circuits will be explained in detail in reference with drawings below.

Figure 4:
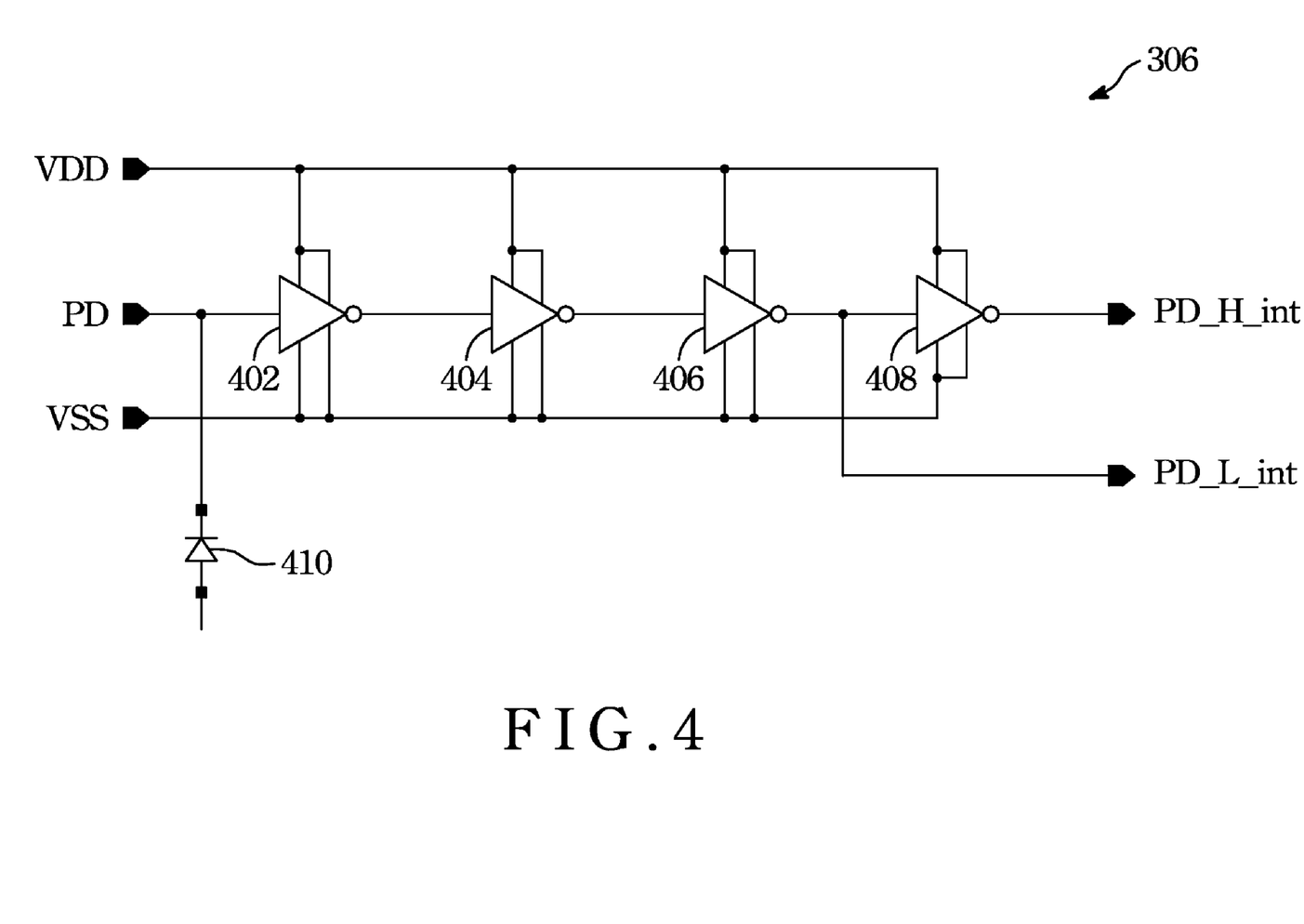
FIG. 4 schematically illustrates a power down control module of the proposed power up/down scheme in accordance with one embodiment of the present invention.

FIG. 4 schematically illustrates the power down control module 306 of the proposed power up/down scheme in accordance with one embodiment of the present invention. A string of inverters 402, 404, 406 and 408 are coupled between the external power supply VDD and the external ground voltage VSS. The inverter 402 has an input terminal coupled to the power down signal PD and to a diode 410. The inverter 406 outputs an initial pull down signal PD_L_int, which is inverted by the inverter 480 into an initial pull up signal PD_H_int.

Figure 5:
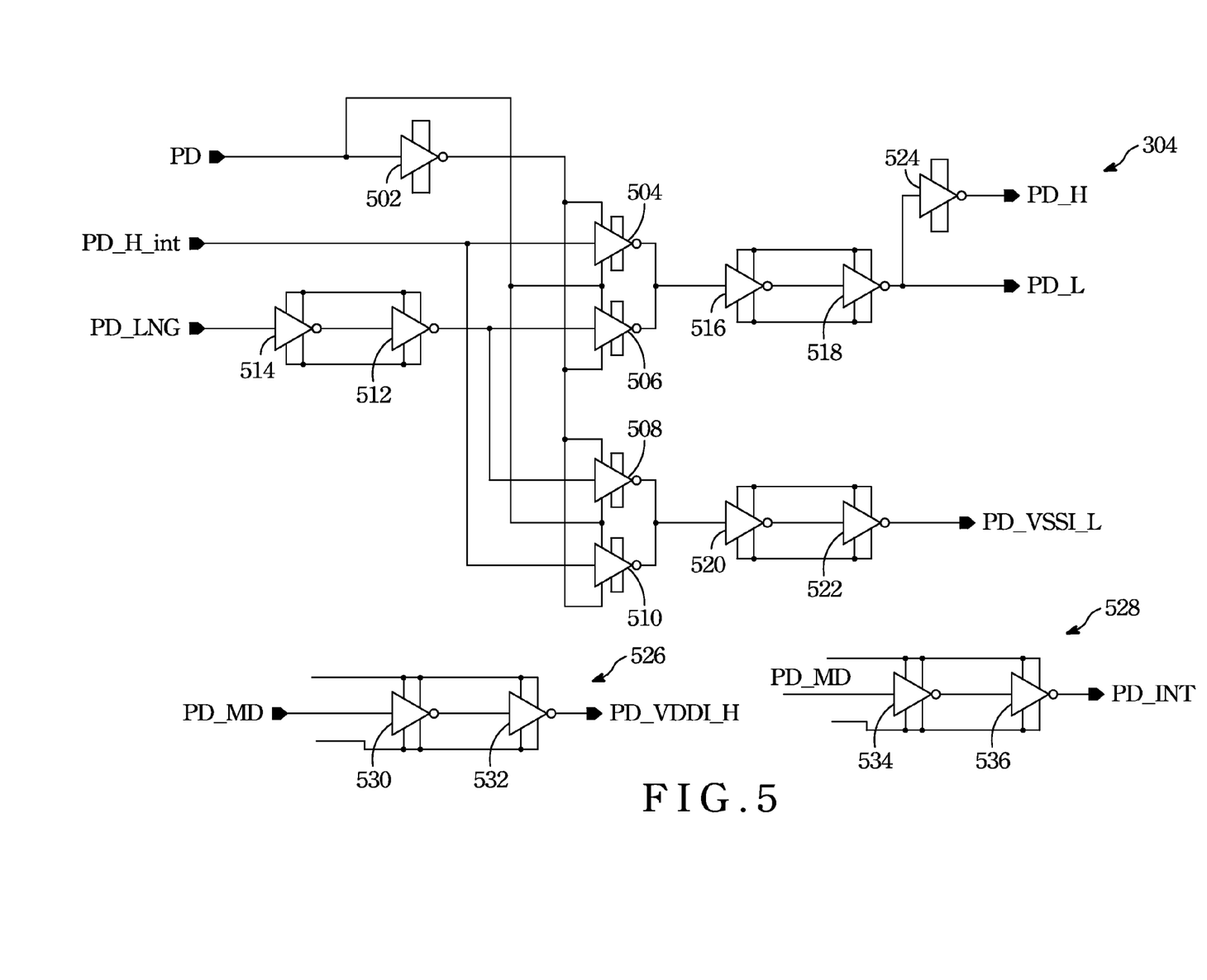
FIG. 5 schematically illustrates a power down select module of the proposed power up/down scheme in accordance with one embodiment of the present invention.

FIG. 5 schematically illustrates the power down select module 304 of the proposed power up/down scheme in accordance with one embodiment of the present invention. An inverter 502 has an input terminal coupled to the power down signal PD, and to inverters 504, 506, 508 and 510. The inverter 504 has an input terminal coupled to an initial pull up signal PD_H_int, and to an input terminal of the inverter 510. The inverter 506 has an input terminal coupled to an input terminal of the inverter 508, and to an output terminal of an inverter 512. An inverter 514 is coupled between an input terminal of the inverter 512 and a second delayed signal PD_LNG. The output terminals of the inverters 504 and 506 are coupled to an input terminal of an inverter 516, which is further connected to an inverter 518. The output terminals 508 and 510 are coupled to an input terminal of an inverter 520, which is further connected to an inverter 522. The inverter 518 outputs a pull down signal PD_L, which is converted into a pull up signal PD_H by an inverter 524. The inverter 522 outputs an internal ground voltage switch control signal PD_VSSI_L.

Referring simultaneously to FIGS. 3 and 5, the power down select module 304 includes a circuit 526 receiving a first delayed signal PD_MD from the delay chain 310 through the load 316d, and outputting an internal power supply switch control signal PD_VDDI_H. The circuit 526 includes inverters 530 and 532 serially coupled between the first delayed signal PD_MD and the power supply control signal PD_VDDI_H. The power down select module 304 also includes a circuit 528 receiving the first delayed signal PD_MD, and outputting an intermediate signal PD_INT. The circuit 528 includes inverters 534 and 536 serially coupled between the first delayed signal PD_MD and the intermediate signal PD_INT.

Figure 6:
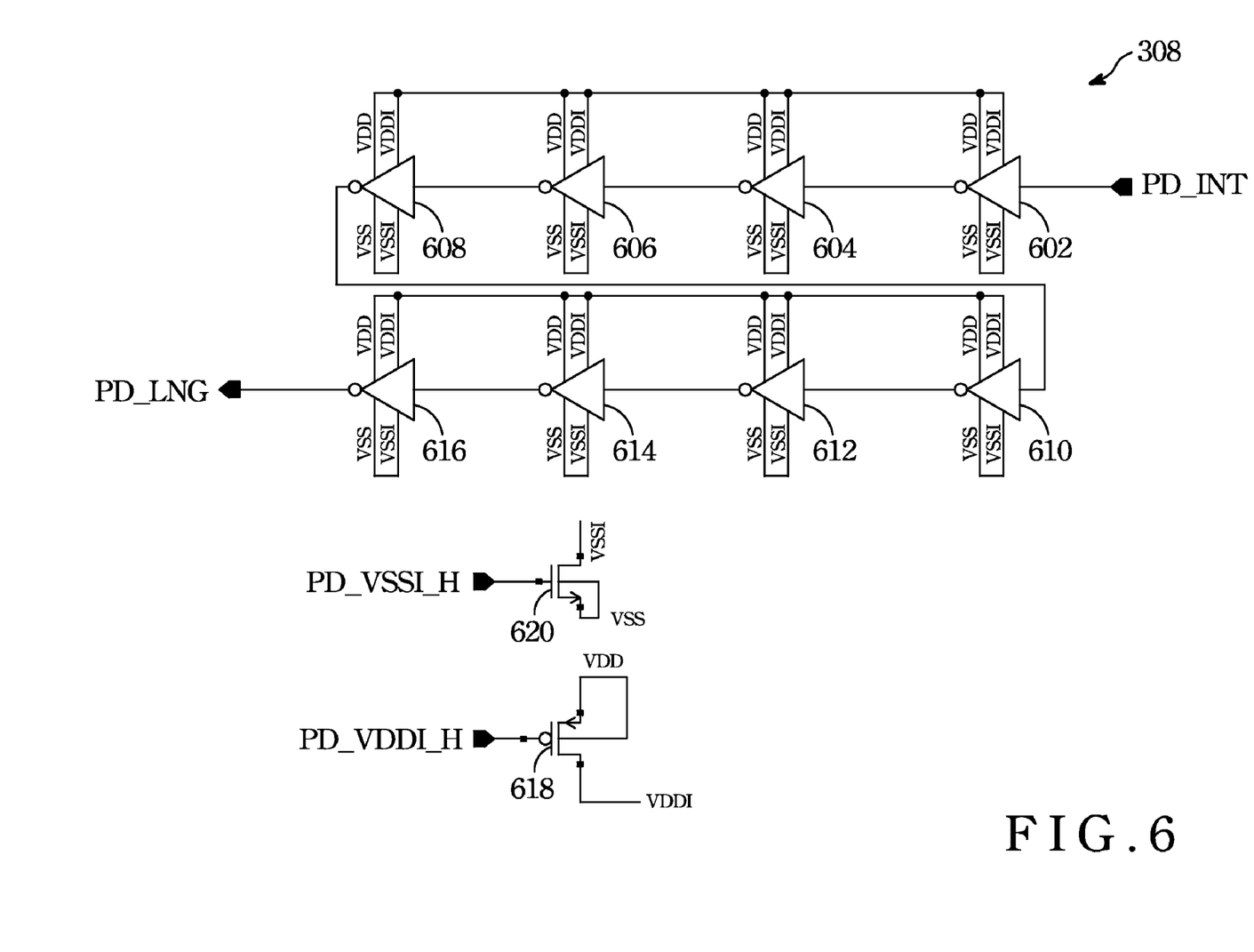
FIG. 6 schematically illustrates a delay chain of the proposed power up/down scheme in accordance with one embodiment of the present invention.

FIG. 6 schematically illustrates the delay chain 308 of the proposed power up/down scheme in accordance with one embodiment of the present invention. Referring simultaneously to FIGS. 3 and 6, the delay chain 308 receives the intermediate signal PD_INT from the power down select module 304, and outputs the second delayed signal PD_LNG. The delay chain 308 includes a plurality of inverters 602, 604, 606, 608, 610, 612, 614 and 616 serially coupled between the intermediate signal PD_INT and the second delayed signal PD_LNG. Each inverter 602, 604, 606, 608, 610, 612, 614 or 616 is coupled between VDD and VSS. The internal power supply VDDI is produced by a PMOS transistor 618 coupled between the external power supply VDD and the internal power supply VDDI, in response to the internal power supply switch control signal PD_VDDI_H. The internal ground voltage VSSI is produced by an NMOS transistor 620 coupled between the external ground voltage VSS and the internal ground voltage VSSI, in response to the internal ground voltage switch control signal PD_VSSI_L.

Figure 7:
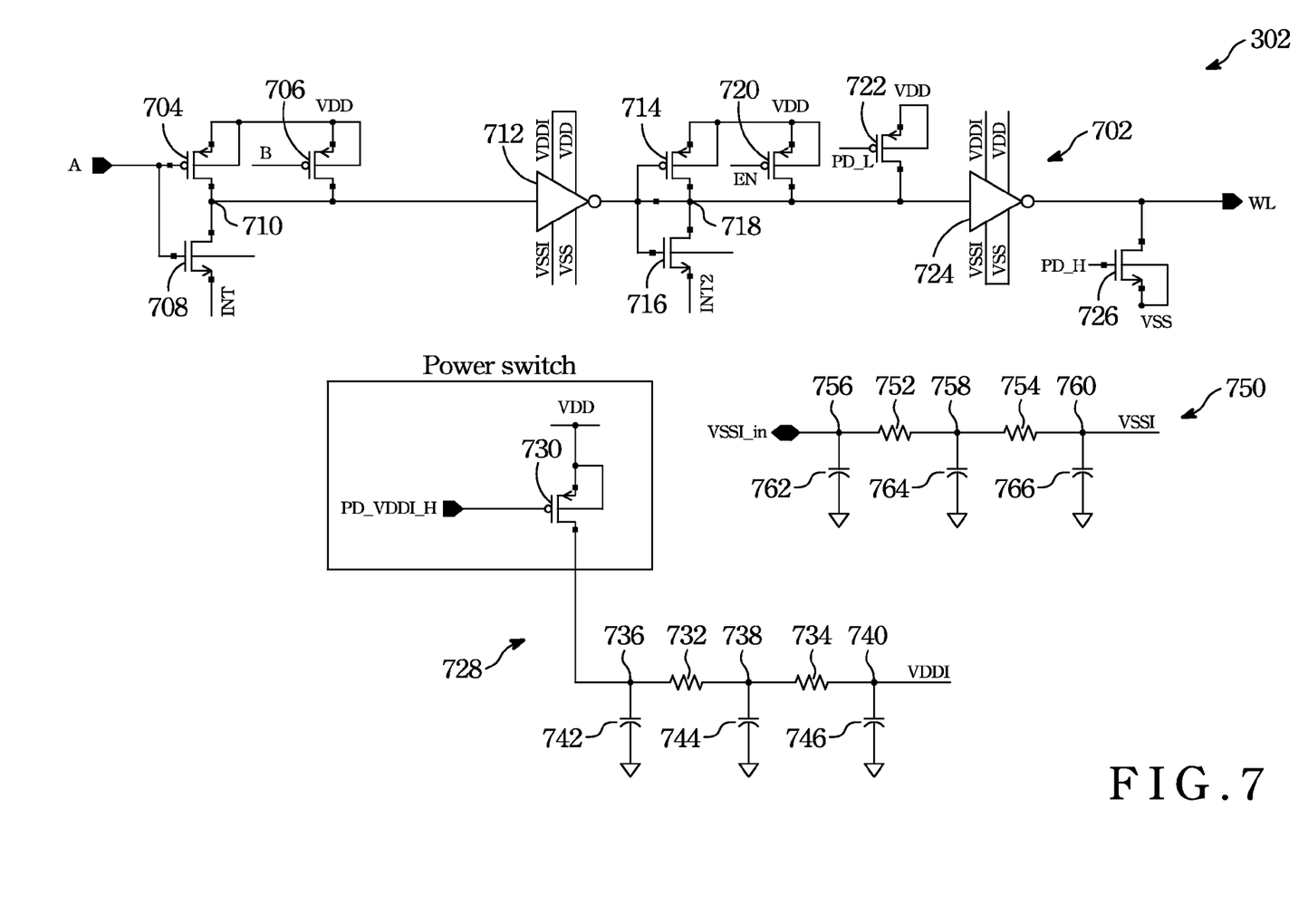
FIG. 7 schematically illustrates an x_decoder of the proposed power up/down scheme in accordance with one embodiment of the present invention.

FIG. 7 schematically illustrates the x_decoder 302 of the proposed power up/down scheme in accordance with one embodiment of the present invention. The x_decoder 302 includes a circuit module 702, which receives an input signal A, and generates output signals on the word line WL. In the circuit module 702, a PMOS transistor 704 has its source coupled to the external power supply VDD, and its drain coupled to a drain of an NMOS transistor 708, wherein the gates of the PMOS transistors 704 and the NMOS transistor 708 are controlled by the input signal A. A PMOS transistor 706 has its source coupled to the external power supply VDD, and its drain coupled to a node 710, and an input terminal of an inverter 712. An output terminal of the inverter 712 is coupled to the gates of PMOS transistors 714 and the NMOS transistor 716. The PMOS transistor 714 has its drain coupled to the drain of the NMOS transistor 716 at a node 718, and its source coupled to the external power supply VDD. A PMOS transistor 720 is coupled between the external power supply VDD and the node 718. The gate of the PMOS transistor 720 is controlled by the enable signal EN. A PMOS transistor 722 is coupled between the external power supply VDD and the node 718, with its gate controlled by the pull down signal PD_L. An inverter 724 is connected between VDD/VDDI and VSS, and has an input terminal coupled to the node 718, and an output terminal coupled to the word line WL. An NMOS transistor 726 is coupled between the word line WL and the external ground voltage VSS, with its gate controlled by the pull up signal PD_H.

The x_decoder 302 includes a power supply switch circuit 728, in which a PMOS transistor 730 has its source coupled to the external power supply VDD, and is controlled by the power supply switch signal PD_VDDI_H. The drain of the PMOS transistor 730 is serially coupled to resistors 732 and 734 through nodes 736, 738 and 740, which are connected to capacitors 742, 744 and 746, respectively.

The x_decoder 302 also includes an internal ground voltage generation circuit 750 receiving an external ground voltage VSS to generate the internal ground voltage VSSI. The internal ground voltage generation circuit 750 is comprised of resistors 752 and 754 serially coupled through nodes 756, 758 and 760, which are coupled to capacitors 762, 764 and 766, respectively.

Referring simultaneously to FIGS. 3 and 4, during the power down process, a power down signal PD is asserted to turn the memory device 300 into a standby mode, and fed to the power down select module 304 and the power down control module 306. The power down signal PD is inverted by the inverters 402, 404 and 406 to generate an initial pull down signal PD_L_int at a low level, and inverted by inverters 402, 404, 406, and 408 to generate an initial pull up signal PD_H_int at a high level. The initial pull up signal PD_H_int is fed to the power down select module 304.

Referring simultaneously to FIGS. 3, 5, 6, and 7 the power down signal PD is converted by the inverters 502, 504, 506, 516, 518 and 524 into a pull up signal PD_H and a pull down signal PD_L for controlling the circuit module 702. The pull up signal PD_H turns on the NMOS transistor 726, and therefore pulls the voltage on the word line WL to the external ground voltage, such that the data integrity of the memory device can be maintained in the power down mode.

The initial pull up signal PD_H_int is fed to the delay chain 310 through the load 316c to generate a first delayed signal PD_MD, which is fed back to the power down select module 304 through the load 316d. In the power down select module 304, the first delay signal PD_MD is converted by the inverters 530 and 532 into an internal power supply switch control signal PD_VDDI_H, which is then fed to the x_decoder 302 through the load 312d. Since the internal power supply switch control signal PD_VDDI_H is produced in response to the first delayed signal PD_MD, its timing would lagged behind that of the pull up signal PD_H and the pull down signal PD_L. As a result, the voltages on the power control nodes will be pulled up/down before the VDD switch is turned off.

In the power down select module 304, the first delayed signal PD_MD is converted by the inverters 534 and 536 into an intermediate signal PD_INT, which is fed to the delay chain 308 though the load 320c. In the delayed chain 308, the intermediate signal PD_INTL is passed through the inverters 602, 604, 606, 608, 610, 612, 614 and 616 to become the second delayed signal PD_LNG having a timing lagged behind the first delayed signal PD_MD. The second delayed signal PD_LNG is fed to the power down select module 304 for generating the internal ground voltage switch control signal PD_VSSI_L, which is applied to the gate of the NMOS transistor 314 to generate the ground voltage control signal VSSI_in to turn off the ground voltage switch. Since the internal ground voltage switch control signal PD_VSSI_L is produced in response to the second delayed signal PD_LNG, its timing would lag behind that of the internal power supply switch control signal PD_VDDI_H. As a result, the VSS switch will be turned off after the VDD switch is turned off.

As discussed above, the embodiment of the present invention discloses a circuitry that pulls up the power control node, and turns off the VDD switch and the VSS switch in a sequential order, during a power down process. This avoids the glitch on the word lines caused by the conventional power down scheme. As a result, the proposed power down sequence scheme ensures the data integrity of the memory cell arrays in the memory device during a power down process.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A method for controlling a word line signal for a memory device during a power down process, comprising:
   pulling the word line signal down to a low logic state;
   disconnecting a current path from an external power supply to an internal power supply after the word line signal has been pulled down to the low logic state; and
   disconnecting a current path from an external ground voltage to an internal ground voltage after a current path from an external power supply to an internal power supply has been completely disconnected.

2. The method of claim 1 comprising generating a power down signal for turning on an PMOS transistor to pass an external supply voltage from the external power supply to an input node of an inverter, which converts the external supply voltage into the word line signal at the low logic state.

3. The method of claim 2 further comprising generating an internal power supply switch control signal for disconnecting the current path from an external power supply to an internal power supply, wherein the internal power supply switch control signal is generated after the power down signal.

4. The method of claim 3 further comprising generating an internal ground voltage switch control signal for disconnecting the current path from an external ground voltage to an internal ground voltage, wherein the internal ground voltage switch control signal is generated after the internal power supply switch control signal.

5. A method for controlling a word line signal for a memory device during a power up process, comprising:
   connecting a current path from an external ground voltage to an internal ground voltage;
   connecting a current path from an external power supply to an internal power supply after the current path from the external ground voltage to the internal ground voltage has been connected; and
   maintaining a word line at a normal operation mode after the current path from the external power supply to the internal power supply has been connected.

6. The method of claim 5 further comprising generating an internal ground voltage switch control signal for connecting the current path from the external ground voltage to the internal ground voltage.

7. The method of claim 6 further comprising generating an internal power supply switch control signal for connecting the current path from the external power supply to the internal power supply, wherein the internal power supply switch control signal is generated after the internal ground voltage switch control signal.

8. The method of claim 7 wherein the step of maintaining comprises generating a power down signal for turning off a PMOS transistor coupled between the external supply voltage and an input node of an inverter, which generates the word line signal in response to an input signal.

9. A memory device comprising:
   a power down control module for generating an initial pull up signal in response to a power down signal;
   a power down select module coupled to the power down control module for generating a pull up signal for enabling power control means to generate a word line signal at a low logic state in response to the pull up signal;
   a first delay chain coupled to the power down control module and the power down select module, the first delay chain generating a first delayed signal in response to the initial pull up signal and sending the first delayed signal to the power down select module, which generates an internal power supply switch control signal in response to the first delayed signal, wherein a timing of the internal power supply switch control signal lags behind that of the pull up signal;
   a second delay chain coupled to the power down select module for generating a second delayed signal in response to an intermediate signal generated by the power down select module, the second delayed signal being fed back to the power down select module to generate an internal ground voltage switch control signal, wherein a timing of the internal ground voltage switch control signal lags behind that of the internal power supply switch control signal; and
   a decoder coupled to the power down select module for pulling the word line signal down to a low logic state in response to the pull up signal, disconnecting a current path from an external power supply to an internal power supply in response to the internal power supply switch control signal after the word line signal has been pulled down to the low logic state, and disconnecting a current path from an external ground voltage to the internal ground voltage in response to the internal ground voltage switch control signal after a current path from an external power supply to an internal power supply has been completely disconnected.

10. The memory device of claim 9 comprising a first NMOS transistor having a source connected to the external ground voltage, a drain connected to the decoder through a load, and a gate controlled by the internal ground voltage switch control signal.

11. The memory device of claim 10 wherein when the power down signal is asserted, the internal ground voltage switch control signal is at a low logic state to turn off the first NMOS transistor.

12. The memory device of claim 11 wherein the decoder comprises a power supply switch for generating an internal power supply voltage in response to the internal power supply switch control signal.

13. The memory device of claim 12 wherein the power supply switch comprises a first PMOS transistor having a source coupled to an external power supply, a gate controlled by the internal power supply switch control signal, and a drain coupled to a first resistor string.

14. The memory device of 13 wherein the decoder comprises a second resistor string having an input end coupled to a ground voltage control signal, and an output end generating the internal ground voltage.

15. The memory device of claim 9 wherein the decoder comprises an inverter having an output terminal coupled to a word line, and an input terminal for receiving a decode signal from outside of the decoder.

16. The memory device of claim 15 wherein the decoder comprises a second PMOS transistor having a source coupled to the external power supply, a drain coupled to the input terminal of the inverter, and a gate controlled by the pull down signal.

17. The memory device of claim 16 wherein the decoder comprises a second NMOS transistor having a source coupled to the external ground voltage, a drain coupled to the output terminal of the inverter, and a gate controlled by the pull up signal.

18. The memory device of claim 9 wherein the first delay chain comprises a first string of inverters, and the second delay chain comprises a second string of inverters.

19. The memory device of claim 9 wherein the power down select module comprises a third string of inverters for generating the intermediate signal in response to the first delayed signal.

20. The memory device of claim 19 wherein the power down select module comprises a fourth string of inverters for generating the second delayed signal in response to the intermediate signal.

* * * * *